(12) United States Patent
Tan et al.

(10) Patent No.: US 11,579,203 B1
(45) Date of Patent: Feb. 14, 2023

(54) CURRENT DETECTION CIRCUIT AND METHOD

(71) Applicant: Halo Microelectronics Co., Ltd., Foshan (CN)

(72) Inventors: Xiaoliang Tan, Foshan (CN); Xinkuan Han, Foshan (CN); Jun Fan, Foshan (CN); Peian Zou, Foshan (CN)

(73) Assignee: Halo Microelectronics Co., Ltd., Foshan (CN)

( * ) Notice: Subject to any disclaimer, the term of this patent is extended or adjusted under 35 U.S.C. 154(b) by 0 days.

(21) Appl. No.: 17/949,349

(22) Filed: Sep. 21, 2022

(30) Foreign Application Priority Data

Jul. 20, 2022  (CN) .......................... 202210854698.8

(51) Int. Cl.
*G01R 31/3842* (2019.01)
*G01R 1/20* (2006.01)
*H02J 1/04* (2006.01)

(52) U.S. Cl.
CPC ......... *G01R 31/3842* (2019.01); *G01R 1/203* (2013.01); *H02J 1/04* (2013.01)

(58) Field of Classification Search
CPC ........ G01R 31/3842; G01R 1/203; H02J 1/04
See application file for complete search history.

(56) References Cited

U.S. PATENT DOCUMENTS 6,407,534 B1 *  6/2002  Mukainakano ...... G01R 31/382
                                                    324/426

FOREIGN PATENT DOCUMENTS

| CN | 101419255 A | 4/2009 |
|----|-------------|--------|
| CN | 104333062 A | 2/2015 |
| CN | 104597310 A | 5/2015 |
| CN | 209105014 U | 7/2019 |
| CN | 111175565 A | 5/2020 |
| CN | 113890312 A | 1/2022 |
| CN | 114355021 A | 4/2022 |
| FR | 2796777 A1  | 1/2001 |

* cited by examiner

*Primary Examiner* — Yoshihisa Ishizuka
(74) *Attorney, Agent, or Firm* — Slater Matsil, LLP

(57) ABSTRACT

A current detection circuit includes a current sampling branch, a switch branch, a first current mirror branch, a capacitor branch, a feedback branch and a control branch. The control branch receives the second current and outputs the first current and the first voltage signal. The current sampling branch outputs a first discharging current. The switch branch establishes and disconnects the connection between the first current mirror branch and the capacitor branch. The capacitor branch is charged in response to the first charging current and discharged in response to the first discharging current. The first current mirror branch outputs the first charging current. The feedback branch adjusts the second charging current to adjust the first charging current, so that the total charge of the capacitor branch is balanced with the total charge of discharge within one switching cycle, so that the first current is represented by the first charging current.

21 Claims, 10 Drawing Sheets

CURRENT DETECTION CIRCUIT AND METHOD

PRIORITY CLAIM

This application claims the benefit of and priority to Chinese Patent Application No. 202210854698.8, filed on Jul. 20, 2022, which is hereby incorporated by reference in its entirety.

TECHNICAL FIELD

The present application relates to the technical field of electronic circuits, and in particular, to a current detection circuit and method used in a charger.

BACKGROUND

With the rapid development of electronic technology, various electronic products play an increasingly important role in people's lives. Electronic products need to consume electricity to operate. All kinds of chargers that match electronic products have emerged and become more and more important. Among them, in order to maintain the stable operation of the charger and the load connected to the charger, the charger usually provides a module to detect the current output.

At present, a commonly used current detection scheme is shown in FIG. 1. Charger 1 supplies power to load 2 after passing through the output inductor Lout and output capacitor Cout. In order to detect the current, an external detection resistor Rsns needs to be placed between the charger 1 and the load 2. The current output by the charger 1 is determined by obtaining the voltage across the detection resistor Rsns.

However, this solution will introduce extra power consumption in the detection resistor Rsns. At the same time, it needs to add two pins ICSP and ICSN connected to the detection resistor Rsns, which will lead to an increase in cost.

SUMMARY

The present application aims to provide a current detection circuit and method, and a charger, which can achieve the purpose of reducing power consumption and cost.

In order to achieve the above object, in a first aspect, the present application provides a current detection circuit for connecting to an electrical load and for detecting a first current flowing into the electrical load.

The current detection circuit comprises a current sampling branch, a switch branch, a first current mirror branch, a capacitor branch, a feedback branch and a control branch.

The control branch is connected to the switch branch and the electrical load. The control branch is configured to receive a second current when connected to an input voltage, and output the first current to the electrical load. The control branch is configured to output a first voltage signal with a first duty cycle to the switch branch.

The current sampling branch is connected to the capacitor branch and the control branch, and the current sampling branch is configured to output a first discharging current proportional to the second current to the capacitor branch based on the second current.

The switch branch is connected to the first current mirror branch and the capacitor branch, and the switch branch is used for establishing and disconnecting the first current mirror branch with the capacitor branch with the first duty cycle. When the first current mirror branch is connected to the capacitor branch, the first current mirror branch outputs a first charging current to the capacitor branch.

The capacitor branch is configured to charge in response to the first charging current and discharge in response to the first discharging current.

The first current mirror branch is connected to the feedback branch, and the first current mirror branch is configured to output a first charging current proportional to the second charging current flowing through the feedback branch.

The feedback branch is connected to the capacitor branch, and the feedback branch is configured to adjust the second charging current based on the first voltage across the two terminals of the capacitor branch, so as to adjust the first charging current to keep the average value of the first voltage across the capacitor branch equal to a first preset voltage. When the average value of the first voltage across both terminals of the capacitor branch is equal to the first preset voltage, the ratio of the first discharging current to the first charging current is equal to the first duty cycle, and the first charging current is used to represent the first current.

In an optional manner, the first current mirror branch is further connected to the control branch. The first current mirror branch is also used to output a third charging current proportional to the first charging current to the control branch. The third charging current is used to represent the first current.

The control branch is further configured to adjust the first duty cycle based on the third charging current to keep the first current equal to a preset output current. The ratio of the second current to the first currents is equal to the first duty cycle.

In an optional manner, the control branch comprises a controller, a first transistor, a first power switch, a second power switch, a first inductor and a first capacitor.

The first terminal of the first transistor is connected to the controller and the current sampling branch. The second terminal of the first transistor is connected to the input voltage. The third terminal of the first transistor is connected to the third terminal of the first power switch and the current sampling branch. The second terminal of the first power switch is connected to the third terminal of the second power switch and the first terminal of the inductor. The second terminal of the first inductor is connected to the first terminal of the first capacitor and the electrical load. The second terminal of the first capacitor is grounded. The first terminal of the power switch and the first terminal of the second power switch are both connected to the controller.

In an optional manner, the control branch further comprises a first operational amplifier and a first resistor. The first resistor is connected to the first current mirror branch and the first operational amplifier. The first resistor is used for generating a first detection voltage based on the third charging current. The first operational amplifier is used to amplify the difference between the first detection voltage and the first reference voltage representing the preset output current. The first operational amplifier outputs a second voltage signal to the controller, so that the controller adjusts the first duty cycle based on the second voltage signal.

In an optional manner, the first terminal of the first resistor is connected to the inverting input terminal of the first operational amplifier and the first current mirror branch. The second terminal of the first resistor is grounded. The non-inverting input terminal of the first operational amplifier is used to receive the first reference voltage, and the output terminal of the first operational amplifier is connected to the controller.

In an optional manner, the first current mirror branch comprises a second transistor and a third transistor. The first terminal of the second transistor is connected to the third terminal of the second transistor. The first terminal of the third transistor is connected to the feedback branch. The second terminal of the second transistor and the second terminals of the third transistors are both connected to the first DC power supply. The third terminal of the third transistor is connected to the switch branch.

In an optional manner, the first current mirror branch also includes a fourth transistor. The first terminal of the fourth transistor is connected to the first terminal of the third transistor. The second terminal of the four transistors is connected to the second terminal of the third transistor. The third terminal of the fourth transistor is connected to the control branch.

In an optional manner, the current sampling branch includes a current sampling unit and a feedback unit. The current sampling unit is connected to the control branch and the feedback unit, and the current sampling unit is configured to output the second discharging current to the feedback unit based on the second current.

The feedback unit is connected to the capacitor branch and the switch branch, and the feedback unit is configured to adjust the second discharging current based on the second current, so that the second discharging current is equal to 1/K of the second current, and is used to output the first discharging current that is proportional to the second discharging current. K is greater than 1.

In an optional manner, the current sampling unit includes a fifth transistor. The first terminal of the fifth transistor is connected to the control branch. The second terminal of the fifth transistor is connected to the input voltage, and the third terminal of the fifth transistor is connected to the feedback unit.

In an optional manner, the feedback unit includes a second operational amplifier, a sixth transistor and a seventh transistor.

The non-inverting input terminal of the second operational amplifier is connected to the control branch. The inverting input terminal of the second operational amplifier is connected to the current sampling unit and the third terminal of the sixth transistor. The output terminal of the second operational amplifier is connected to the first terminal of the sixth transistor and the first terminal of the seventh transistor. The second terminal of the sixth transistor and the second terminal of the seventh transistor are both connected grounded. The third terminal of the seventh transistor is connected to the capacitor branch and the switch branch.

In an optional manner, the switch branch includes an inverter, a first switch and a second switch.

The input terminal of inverter is connected to the first terminal of the first switch and the control branch. The output terminal of the inverter is connected to the first terminal of the second switch. The second terminal of the first switch is connected to the second terminal of the second switch and the first current mirror branch. The third terminal of the first switch is connected to the capacitor branch, the current sampling branch and the feedback branch. The third terminal of the second switch is grounded.

In an optional manner, when the first voltage signal is at a high level, the first switch is turned on to establish the connection between the first current mirror branch and the capacitor branch. When the first voltage signal is at a low level, the first switch is turned off to disconnect the first current mirror branch from the capacitor branch.

In an optional manner, the capacitor branch includes a second capacitor. The first terminal of the second capacitor is connected to the switch branch, the feedback branch and the current sampling branch. The second terminal of the second capacitor is grounded.

In an optional manner, the feedback branch includes a third operational amplifier, an eighth transistor and a second resistor.

The non-inverting input terminal of the third operational amplifier is used to input the first preset voltage. The inverting input terminal of the third operational amplifier is connected to the switch branch, the capacitor branch and the current sampling branch. The output terminal of the third operational amplifier is connected to the first terminal of the eighth transistor. The second terminal of the eighth transistor is connected to the first terminal of the second resistor. The second terminal of the second resistor is grounded. The third terminal of the eighth transistor is connected to the first current mirror branch.

In an optional manner, a second current mirror branch is also included. The second current mirror branch is connected to the current sampling branch and the control branch, and the second current mirror branch is used to output a third discharging current proportional to the first discharging current. The third discharging current is output to the control branch.

The control branch is further configured to determine whether the second current is greater than a preset input current threshold based on the third discharging current, so as to reduce the first duty cycle when the second current is greater than a preset input current threshold.

In an optional manner, the second current mirror branch includes a ninth transistor, a tenth transistor and an eleventh transistor.

The first terminal of the ninth transistor is connected to the current sampling branch. The second terminal of the ninth transistor is grounded, and the third terminal of the ninth transistor is connected to the third terminal of the tenth transistor, the first terminal of the tenth transistor and the first terminal of the eleventh transistor. The second terminal of the tenth transistor and the second terminal of the eleventh transistor are both connected to the second DC power supply. The third terminal of the eleventh transistor is connected to the control branch.

In an optional manner, the control branch further includes a fourth operational amplifier and a third resistor. The third resistor is connected to the second current mirror branch and the fourth operational amplifier. The third resistor is used for generating a second detection voltage based on the third discharging current. The fourth operational amplifier is used for comparing the second detection voltage with a second reference voltage representing a preset input current threshold to output a third voltage signal to the controller, so that the controller can adjusts the first duty cycle based on the third voltage signal.

In an optional manner, the first terminal of the third resistor is connected to the inverting input terminal of the fourth operational amplifier and the second current mirror branch. The non-inverting input terminal of the fourth operational amplifier is used to receive the second reference voltage. The output terminal of the fourth operational amplifier is connected to the control branch.

In a second aspect, the present application provides a current detection method, which is applied to a current detection circuit. The current detection circuit comprises a capacitor branch. The method is used to detect the first current flowing into the electrical load based on the second current flowing into the current detection circuit.

The method includes obtaining the first discharging current that is proportional to the second current, so as to continuously discharge the capacitor branch, and simultaneously charge the capacitor branch intermittently with the first charging current, adjusting the average value of the first voltage across both terminals of the capacitor branch to be equal to the first preset voltage, so that the total charge discharged by the capacitor branch in one cycle is equal to the total charge charged.

Based on the first discharging current, determine the first charging current used for charging the capacitor branch. In one cycle, the duration of charging of the capacitor branch is the duration that the input voltage supplies power to the electrical load, and the duration of the capacitor branch discharging is the duration of one cycle.

Based on the first charging current, determine the first current.

In an optional manner, obtaining the first charging current for charging the capacitor branch through the first discharging current includes the following:

The first charging current is obtained by the following formula:

$$I1 = I2 \times T/Ton$$

I1 is the first charging current. I2 is the first discharging current. Ton is the charging duration of the capacitor branch in one cycle, and T is the duration of one cycle.

In an optional manner, the second current is K times greater than the first discharging current. K is greater than 1.

The determining the first current based on the first charging current includes the following:

The magnitude of the first current is determined by the following equation:

$$Iout = I1 \times K$$

Iout is the first current.

In a third aspect, the present application provides a current detection circuit comprising a capacitor branch for charging and discharging and a control processing unit comprising at least one processor and a memory communicatively connected to the at least one processor. The memory stores instructions executable by the at least one processor. The instructions are executed by the at least one processor, to enable the at least one processor to perform the method as described above.

In a fourth aspect, the present application provides a charger including the current detection circuit as described above.

The beneficial effects of the present application are as follows: the current detection circuit provided by the present application is used to connect with the electrical load and to detect the first current flowing into the electrical load. The current detection circuit includes a current sampling branch, a switch branch, a first current mirror branch, a capacitor branch, a feedback branch and a control branch. The control branch is connected to the switch branch and the electrical load. The control branch is used for receiving the second current when connected to the input voltage, outputting the first current to the electrical load and outputting a voltage signal with the first duty cycle to the switch branch. The current sampling branch is connected to the capacitor branch and the control branch. The current sampling branch is used for outputting a first discharging current proportional to the second current to the capacitor branch. The switch branch is connected to the first current mirror branch and the capacitor branch. The switch branch is used for establishing and disconnecting the connection between the first current mirror branch and the capacitor branch with a first duty cycle. When the first current mirror branch is connected to the capacitor branch, the first current mirror branch outputs the first charging current to the capacitor branch. The capacitor branch is charging in response to the first charging current and discharging in response to the first discharging current. The first current mirror branch is connected to the feedback branch, and the first current mirror branch is used for outputting a first charging current proportional to the second charging current flowing through the feedback branch. The feedback branch is connected to the capacitor branch, and the feedback branch is used to adjust the second charging current based on the first voltage across both terminals of the capacitor branch, so as to adjust the average value of the first voltage across both terminals of the capacitor branch to be equal to the first preset voltage through adjusting the first charging current. When the average value of the first voltages across both terminals of the capacitor branch is equal to the first preset voltage, the ratio of the first charging current to the first discharging current is equal to the first duty cycle and the first current is represented by the first charging current. In the above manner, the first current is represented by the first charging current, that is, the detection process of the first current is realized, and there is no need to add an additional detection resistor as in the related art, and there is no need to add an additional connection pin, thereby both power consumption and cost are reduced.

BRIEF DESCRIPTION OF THE DRAWINGS

One or more embodiments are exemplified by the pictures in the corresponding drawings, and these exemplifications do not constitute limitations of the embodiments, and elements with the same reference numerals in the drawings are represented as similar elements, unless otherwise specified, the figures in the accompanying drawings do not constitute a limitation of the proportional relationship.

DETAILED DESCRIPTION OF ILLUSTRATIVE EMBODIMENTS

In order to make the purposes, technical solutions and advantages of the embodiments of the present application clearer, the technical solutions in the embodiments of the present application will be described clearly and completely below with reference to the drawings in the embodiments of the present application. Obviously, the described embodiments are part of the embodiments of the present application, but not all of the embodiments. Based on the embodiments in the present application, all other embodiments obtained by those of ordinary skill in the art without creative efforts shall fall within the protection scope of the present application.

Figure 1:
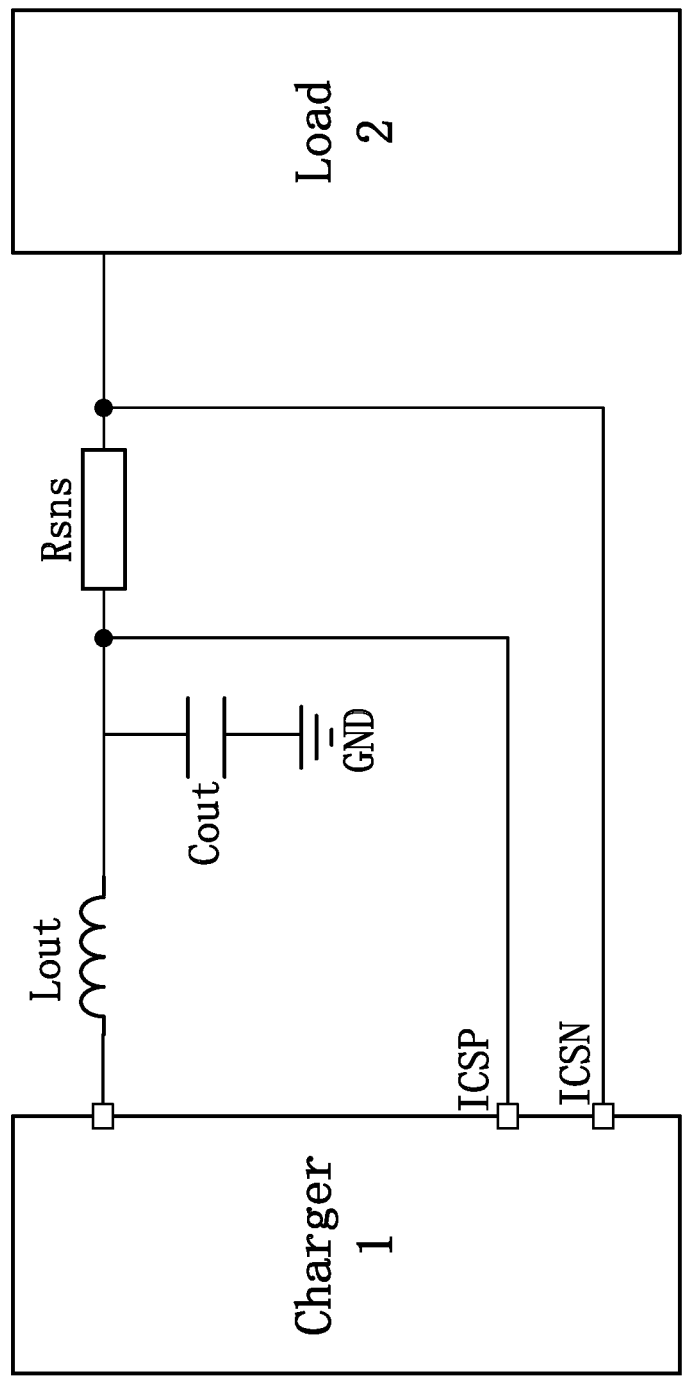
FIG. 1 is a schematic diagram of the structure between a charger and a load in the related art.
Figure 2:
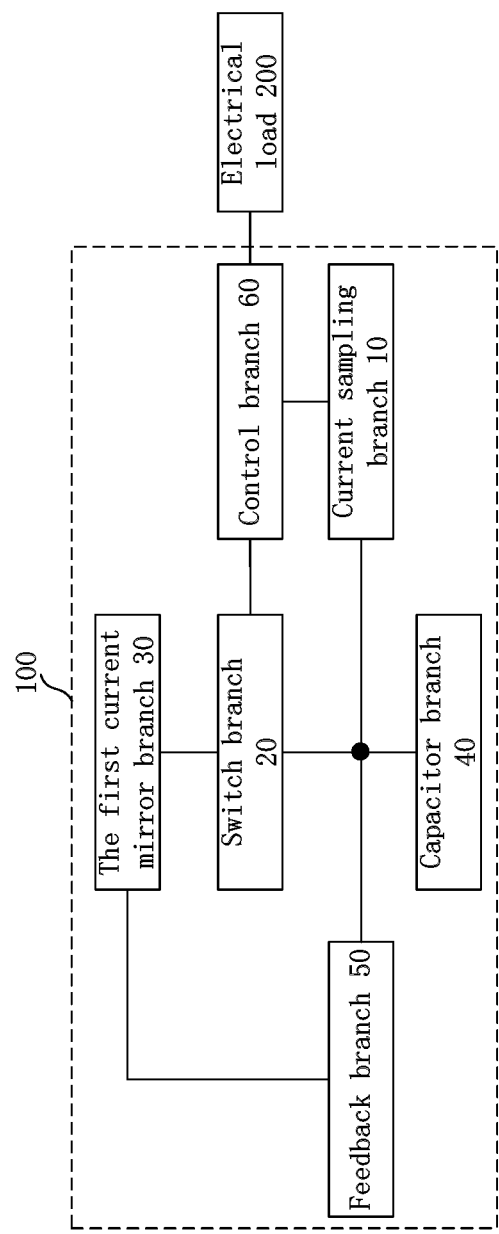
FIG. 2 is a schematic structural diagram of a current detection circuit provided by an embodiment of the present application.

Please refer to FIG. 2, which is a schematic structural diagram of a current detection circuit provided by an embodiment of the present application. As shown in FIG. 2, the current detection circuit 100 is used for connecting with the electrical load 200. The current detection circuit 100 is used for detecting the first current flowing into the electrical load 200, and the current detection circuit 100 includes a current sampling branch 10, a switch branch 20, a first current mirror branch 30, a capacitor branch 40, a feedback branch 50 and a control branch 60.

The control branch 60 is connected to the switch branch 20 and the electrical load 200. The current sampling branch 10 is connected to the capacitor branch 40, the switch branch 20, the feedback branch 50 and the control branch 60. The switch branch 20 is connected to the first current mirror branch 30, the feedback branch 50, the capacitor branch 40, the first current mirror branch 30. The first current mirror branch 30 is connected to the feedback branch 50. The feedback branch 50 is connected to the capacitor branch 40. Specifically, the first terminal of the control branch 60 is connected to the first terminal of the switch branch 20. The second terminal of the current sampling branch 10 is connected to the first terminal of the capacitor branch 40, the second terminal of the switch branch 20 and the first terminal of the feedback branch 50. The first terminal of the current sampling branch 10 is connected to the second terminal of the control branch 60. The third terminal of the switch branch 20 is connected to the first terminal of the first current mirror branch 30. The second terminal of the first current mirror branch 30 is connected to the second terminal of the feedback branch 50.

In this embodiment, the control branch 60 is used to be input the second current when it is connected to the input voltage, and the control branch 60 outputs the first current to the electrical load 200. At the same time, the control branch 60 outputs the first voltage signal with the first duty cycle to the switch branch 20, and the second current increases or decreases together with the first current. The current sampling branch 10 is configured to output a first discharging current proportional to the second current to the capacitor branch 40. The switch branch 20 is used for establishing and disconnecting the connection between the first current mirror branch 30 and the capacitor branch 40 with a first duty cycle. When the first current mirror branch 30 is connected to the capacitor branch 40, the first current mirror branch 30 outputs a first charging current to the capacitor branch 40. The capacitor branch 40 is used for charging in response to the first charging current and discharging in response to the first discharging current. The first current mirror branch 30 is used for outputting the first charging current proportional to a second charging current flowing through the feedback branch 50. The feedback branch 50 is configured to adjust the second charging current based on the first voltage across the capacitor branch 40, so as to make the average value of the first voltage across the capacitor branch 40 equal to a first preset voltage through the first charging current. When the average value of the first voltage across the capacitor branch 40 is equal to the first preset voltage, the ratio of the first charging current to the first discharging current is equal to the first duty cycle, so that the first charging current can be used to represents the first current.

The first preset voltage may be set according to actual application conditions, which is not specifically limited in this embodiment of the present application.

In addition, in the embodiments of the present application, the proportional relationship between the two variables means that the ratio between the two variables is K, and K is not zero. The value of K can be set according to the actual application. The embodiment does not specifically limit this. For example, if the two variables are the second current and the first discharging current respectively, the proportional relationship between the second current and the first discharging current means that the ratio of the second current to the first discharging current is K.

Meanwhile, in the embodiments of the present application, using one variable to represent another variable means that there is a corresponding relationship between the two variables, and one variable can represent another variable in combination with the corresponding relationship. For example, the first current is represented by the first charging current, that is, there is a corresponding relationship between the first charging current and the first current, and the combination of the first charging current and the corresponding relationship may represent the first current.

Specifically, when the control branch 60 is connected to the input voltage, the second current is input to the control branch 60, so that the current sampling branch 10 outputs the first discharging current that is proportional to the second current to the capacitor branch 40, thereby the capacitor branch 40 is discharged based on the first discharging current.

At the same time, the control branch 60 outputs a first current to the electrical load 200 to supply power to the electrical load, and the control branch 60 outputs a first voltage signal with the first duty cycle to the switch branch 20. Then, the switch branch 20 establishes the connection between the first current mirror branch 30 and the capacitor branch 40 during the period when the first voltage signal is at a high level, so that the first current mirror branch 30 outputs the first charging current to the capacitor branch 40. As a result, the capacitor branch is charged based on the first charging current.

Furthermore, the feedback branch 50 adjusts the second charging current flowing through the feedback branch 50 based on the first voltage across the capacitor branch 40 to adjust the first charging current. The average value of the first voltage is adjusted to be equal to the first preset voltage by adjusting the first charging current. At this time, the average value of the first voltage remains unchanged, that is, the amount of electricity charged by the capacitor branch 40 is equal to the amount of electricity discharged. The amount of electricity charged by the capacitor branch 40 is the amount of electricity charged by the first charging current I1 during the period when the first voltage signal is at a high level. The amount of electricity discharged by the capacitor branch 40 is the amount of electricity discharged by the first discharging current I2 in the entire cycle. So, I1×T×D=I2×T can be obtained. The ratio of the first discharging current I2 to the first charging current I1 can be obtained by simplifying this equation, that is, the first duty cycle D. Then, the first discharging current I2 can be represented by the first charging current I1, and since the first discharging current I2 is proportional to the second current, the first current can be represented by the first charging current I1. That is, the detection process of the first current is realized, and there is no need to add an additional detection resistor as in the related art, and there is no need to add an additional connection pin, which reduces both power consumption and cost.

Figure 3:
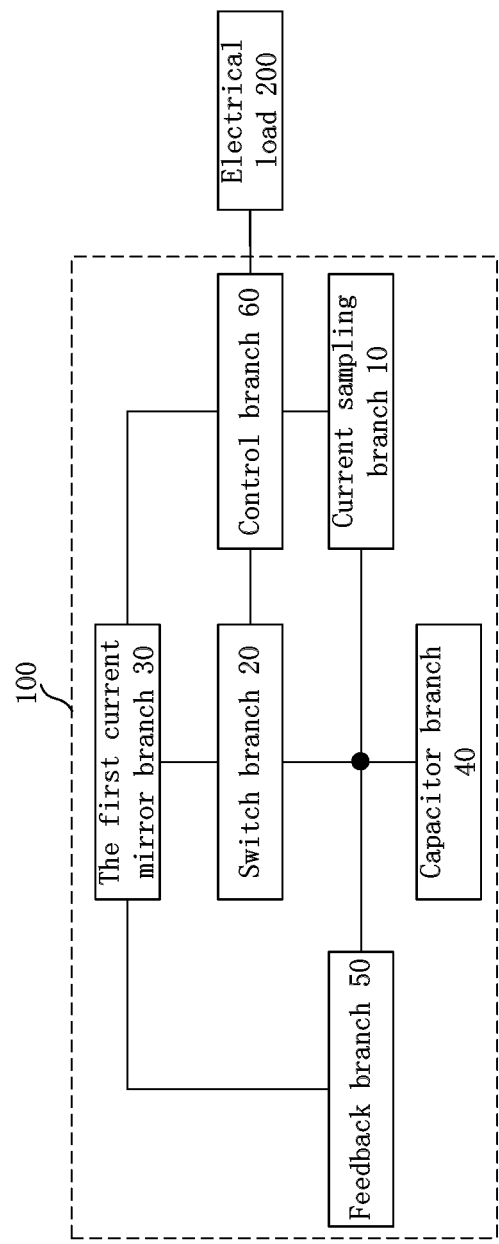
FIG. 3 is a schematic structural diagram of a current detection circuit provided by another embodiment of the present application.

In an embodiment, as shown in FIG. 3, the first current mirror branch 30 is also connected to the control branch 60, that is, the third terminal of the first current mirror branch 30 is also connected to the third terminal of the control branch 20.

The first current mirror branch 30 is further configured to output a third charging current proportional to the first charging current to the control branch 20, where the third charging current is used to represent the first current. The control branch 60 is further configured to adjust the first duty cycle based on the third charging current to keep the first current equal to the preset output current. The ratio of the second current to the first current is the first duty cycle.

In this embodiment, since the third charging current is proportional to the first charging current I1, and the first charging current I1 can be used to represent the first current, the third charging current can also be used to represent the first current. The control branch 60 can determine whether the first current at a certain time is equal to the preset output current through the third charging current, and can adjust the first duty cycle D to change the first current when the first current at that certain time is not equal to the preset output current and make the magnitude of the first current converge to the preset output current. Specifically, when the electrical load 200 remains unchanged, the first current is determined by the output voltage VOUT provided by the control branch 60 to the electrical load 200. The higher the output voltage VOUT, the higher the first current. Meanwhile, the output voltage VOUT is determined by the first duty cycle D and the input voltage VIN. Under the condition that the input voltage VIN remains unchanged, the output voltage VOUT is proportional to the first duty cycle D, that is, the larger the first duty cycle D (closer to 1), the higher the output voltage VOUT is (closer to VIN), so the corresponding first current is larger. That is, the purpose of adjusting the first current can be achieved by adjusting the first duty cycle D, so as to keep the first current equal to the preset output current, so that a stable current can be provided for the electrical load 200 to keep the electrical load 200 operating stably. The preset output current may be set according to actual application conditions, which is not specifically limited in this embodiment of the present application. For example, when the electrical load 200 is a lithium battery, the preset output current can be configured as the current during constant current charging of the lithium battery. Through accurate detection and closed-loop control of the first current, the battery can be quickly charged while maintaining the battery safe charging.

Figure 4:
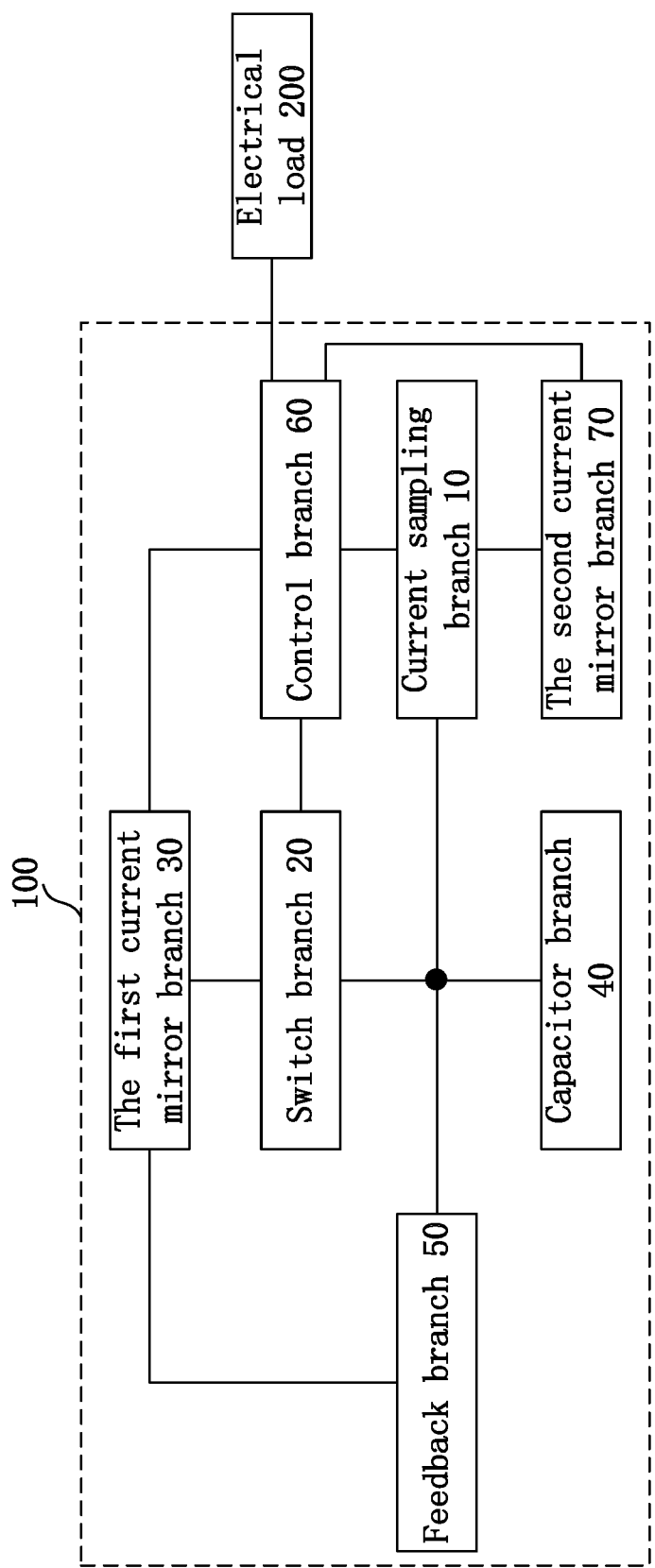
FIG. 4 is a schematic structural diagram of a current detection circuit provided by another embodiment of the present application.

In one embodiment, as shown in FIG. 4, the current detection circuit 100 further includes a second current mirror branch 70. The second current mirror branch 70 is connected to the current sampling branch 10 and the control branch 60, that is, the first terminal of the second current mirror branch 70 is connected to the third terminal of the current sampling branch 10. The second terminal of the second current mirror branch 70 is connected to the fourth terminal of the control branch 60.

Specifically, the second current mirror branch 70 is used to output a third discharging current proportional to the first discharging current, and the third discharging current is output to the control branch 60. The control branch 60 is further configured to determine whether the second current is greater than a preset input current threshold based on the third discharging current, so as to reduce the first duty cycle when the second current is greater than the preset input current threshold.

In this embodiment, since the first discharging current is proportional to the second current, and the third discharging current is proportional to the first discharging current, the third discharging current is proportional to the second current. Therefore, by obtaining the third discharging current, the control branch 60 can correspondingly determine whether the second current is greater than the preset input current threshold. Furthermore, when the control branch 60 determines that the second current is greater than the preset input current threshold, it indicates that the second current is too large. At this time, the first duty cycle needs to be reduced to reduce the first current to prevent damage to the power supply providing the input voltage VIN and the second current due to excessive current. The preset input current threshold may be set according to actual application conditions, which is not specifically limited in this embodiment of the present application. For example, when the input voltage VIN is provided through the USB port, the currents supported by different USB power supply protocols are different. The preset input current threshold can be set to ensure that the input current of the system does not exceed the maximum current that the USB port can provide to maintain stable operation of the power supply that provides the input voltage VIN.

Figure 5:
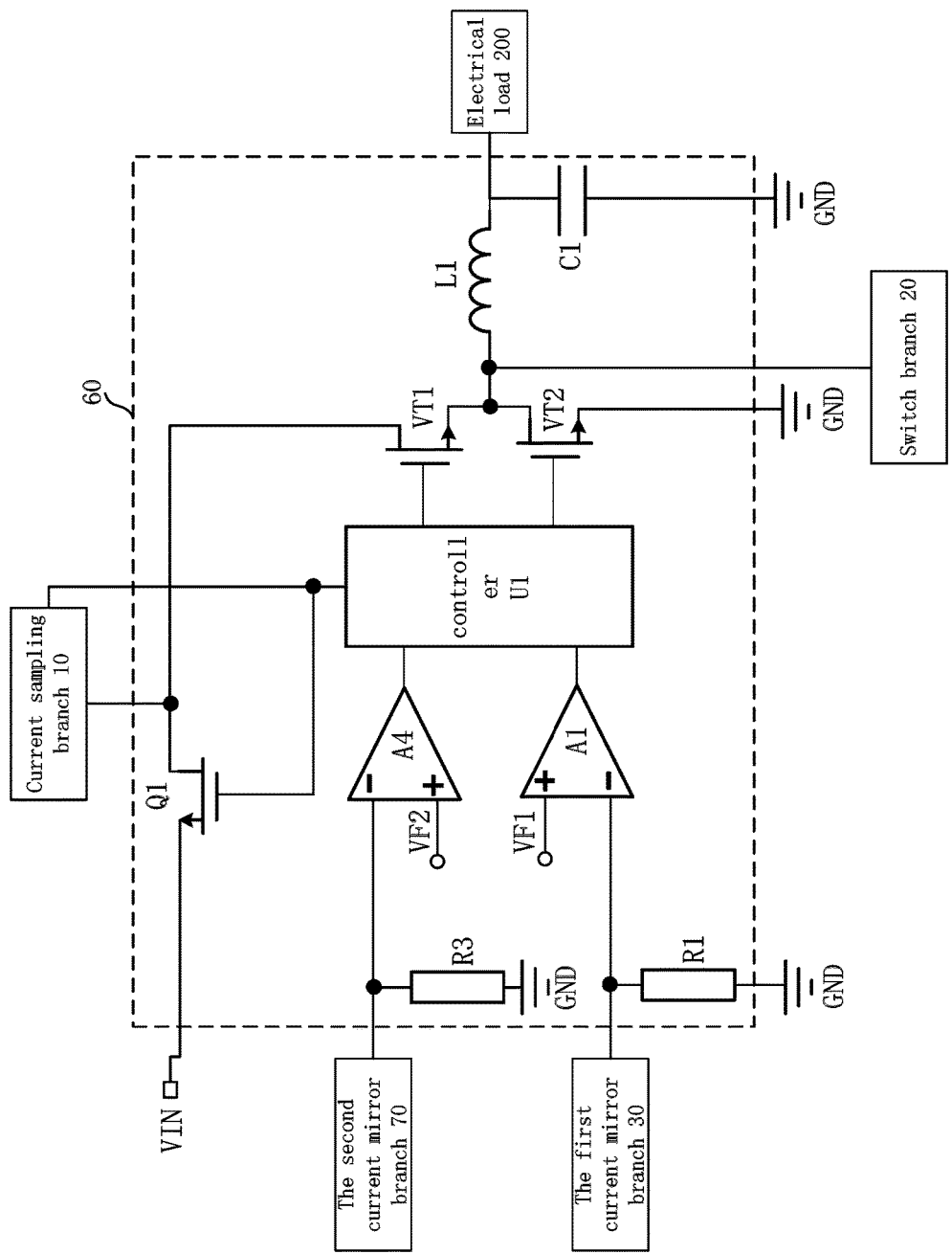
FIG. 5 is a schematic diagram of a circuit structure of a control branch provided by an embodiment of the present application.

Please refer to FIG. 5, which exemplarily shows a structure of the control branch 60. As shown in FIG. 5, the control branch 60 includes a controller U1, a first transistor Q1, a first power switch VT1, a second power switch VT2, a first inductor L1 and a first capacitor C1.

The first terminal of the first transistor Q1 is connected to the controller U1 and the current sampling branch 10. The second terminal of the first transistor Q1 is connected to the input voltage VIN. The third terminal of the first transistor Q1 is connected to the third terminal of the power switch VT1 and the current sampling branch 10. The second terminal of the first power switch VT1 is connected to the third terminal of the second power switch VT2 and the first terminal of the first inductor L1. The second terminal of the first inductor L1 is connected to the first terminal of the first capacitor C1 and the electrical load 200. The second terminal of the first capacitor C1 is grounded to GND. The first terminal of the first power switch and the first terminal of the second power switch VT2 are connected to the controller U1.

In this embodiment, the first transistor Q1, the first power switch transistor VT1, and the second power switch transistor VT2 are all NMOS transistors as an example. The gate of the NMOS transistor is the first terminal of the first transistor Q1 (the first power switch VT1 or the second power switch VT2), and the source of the NMOS transistor is the second terminal of the first transistor Q1 (the first power switch VT1 or the second power switch VT2). The drain of the NMOS transistor is the third terminal of the first transistor Q1 (the first power switch transistor VT1 or the second power switch transistor VT2).

The first transistor Q1 operates in the variable resistance region, that is, the first transistor Q1 can be regarded as a variable resistor controlled by the voltage difference between the source and the gate of the first transistor Q1. The first power switch VT1 and the second power switch VT2 can be regarded as operating in a switch mode.

Besides, the first power switch VT1 and the second power switch VT2 can be any controllable switches, such as insulated gate bipolar transistor (IGBT) devices, integrated gate commutated thyristor (IGCT) devices, gate Extremely turn-off thyristor (GTO) devices, silicon-controlled rectifier (SCR) devices, junction gate field effect transistor (JFET) devices, MOS controlled thyristor (MCT) devices, etc. In addition, the first power switch VT1 and the second power switch VT2 shown in FIG. 5 may be implemented as multiple switches connected in parallel.

In this embodiment, Ton is defined as the duration that the first power switch VT1 is turned on in one cycle T (that is, the gate control signal of the first power switch VT1 is at a high level). That is, the duration of time in one cycle T during which the input voltage VIN is supplying power to the electrical load 200. During the period of one cycle T where the gate signal of the first power switch VT1 is at a high level, the first power switch VT1 is turned on, and the second power switch VT2 is turned off. The input voltage VIN charges the first inductor L1, and the current IL flowing through the first inductor L1 increases. During the period of one cycle T where the gate signal of the first power switch VT1 is at a low level, the first power switch VT1 is turned off, and the second power switch VT2 is turned on. The charge stored in the first inductor L1 is discharged to supply power to the electrical load 200, and the current IL decreases. This process is cycled until the charge and discharge are balanced, and the following equation can be obtained in steady state:

$$D = \frac{Ton}{T} = VOUT/(\eta \times VIN) \tag{1}$$

Among them, D is the fraction of the time where the gate signal of the first power switch VT1 is at a high level in one cycle time T, which is also the first duty cycle. η is the power stage efficiency. VOUT is the output voltage of the control branch 60, which is also the voltage supplied to the electrical load 200. VIN is the input voltage.

Based on the energy conservation theory, the following can be obtained:

$$(\eta \times VIN \times IIN = VOUT \times Iout) \tag{2}$$

IIN is the second current, and Iout is the first current.

Combining Equation (1) and Equation (2), the following can be obtained:

$$Iout = IIN/D \tag{3}$$

According to Equation (3), Iout can be obtained by dividing IIN by the first duty cycle D, that is, the ratio of the second current to the first current is the first duty cycle D.

In one embodiment, please continue to refer to FIG. 5, the control branch 60 outputs a first voltage signal with a first duty cycle D, and the first voltage signal is also the voltage signal at the second terminal of the first power switch VT1 and the third terminal of the power switch VT2. At this time, the switch branch 20 is connected to the second terminal of the first power switch VT1. As mentioned above, the duty cycle of the voltage signal here is the first duty cycle FIG. 5 only exemplarily shows one way of connecting the switch branch 20 and the control branch 60, so as to realize the control of the switch branch 20. In other embodiments, other signals in the control branch 60 can also be used as control signals of the switch branch 20, which are not specifically limited in this embodiment of the present application. For example, in other embodiments, the gate signal of the first power switch VT1 can also be used as the first voltage signal provided by the control branch 60 to the switch branch 20, and its duty cycle is also the first duty cycle D. In this case, the switch branch 20 is connected to the first terminal of the first power switch VT1. It should be noted that the gate signal of the second power switch VT2 is complementary to that of the first power switch VT1, and the duty cycle of the gate signal of the second power switch VT2 is about (1-D). For another example, in other embodiments, the first voltage signal provided by the control branch 60 to the switch branch 20 may also be a signal derived from the gate or source voltage signal of the first power switch VT1. For another example, in one embodiment, the first voltage signal provided by the control branch 60 to the switch branch 20 may also be a digital signal provided by the controller U1 with a duty cycle of the first duty cycle D., In an embodiment, please continue to refer to FIG. 5, the control branch 60 further includes a first operational amplifier A1 and a first resistor R1. The first resistor R1 is connected to the first current mirror branch 30 and the first operational amplifier A1. Specifically, the first terminal of the first resistor R1 is connected to the inverting input terminal of the first operational amplifier A1 and the third terminal of the first current mirror branch 30. The second terminal of the first resistor R1 is grounded to GND. The non-inverting input terminal of the operational amplifier A1 is used to receive the first reference voltage VF1, and the output terminal of the first operational amplifier A1 is connected to the controller U1.

The first resistor R1 is used to generate the first detection voltage based on the third charging current. The first operational amplifier A1 is used to amplify the difference between the first detection voltage and the first reference voltage VF1 representing the preset output current, so as to output a second voltage signal to the controller U1, so that the controller U1 adjust the first duty cycle based on the second voltage signal to keep the first current equal to the preset output current. Specifically, the first detection voltage can be used to represent the third charging current. The first reference voltage VF1 can be used to represent the preset output current, and the difference between the first detection voltage and the first reference voltage VF1 is amplified to be the second voltage signal. The second voltage signal can represent the difference between the first current and the preset output current, and the control branch 60 can determine whether the first current at a moment is equal to the preset output current based on the difference, and then can adjust the first duty cycle when the first current at that moment is not equal to the preset output current. As mentioned above, adjusting the first duty cycle can achieve the purpose of adjusting the first current to keep the first current equal to the preset output current. Therefore, a stable current can be provided to the electrical load 200 to maintain the stability of the operation of the electrical load 200.

In one embodiment, please continue to refer to FIG. 5, the control branch 60 further includes a fourth operational amplifier A4 and a third resistor R3. The third resistor R3 is connected to the second current mirror branch 70 and the fourth operational amplifier A4.

Specifically, the third resistor R3 is used to generate the second detection voltage based on the third discharging current. The fourth operational amplifier A4 is used for comparing the second detection voltage with the second reference voltage VF2 representing the preset input current threshold, to output a third voltage signal to the controller U1, so that the controller U1 can adjust the first duty cycle based on the third voltage signal. The second detection voltage can be used to represent the third discharging current, which in turn represents the second current. The second reference voltage VF2 can be used to represent the preset input current threshold. The difference between the second detection voltage and the second reference voltage VF2 is amplified by the fourth operational amplifier A4 and is output as a third voltage signal. The third voltage signal can represent the difference between the second current and the preset input current threshold. Based on the difference, the controller U1 can determine whether the second current at a moment exceeds the preset input current threshold value, so that when second current at that moment is greater than the preset input current threshold value, reduced the first duty cycle so as to achieve the purpose of input overcurrent protection. As mentioned above, reducing the first duty cycle can achieve the purpose of reducing the first current. As the first current decreases, the second current also decreases, so as to keep the second current not exceeding the maximum current that the power supply can supply to protect the power supply that provides the input voltage VIN.

Figure 6:
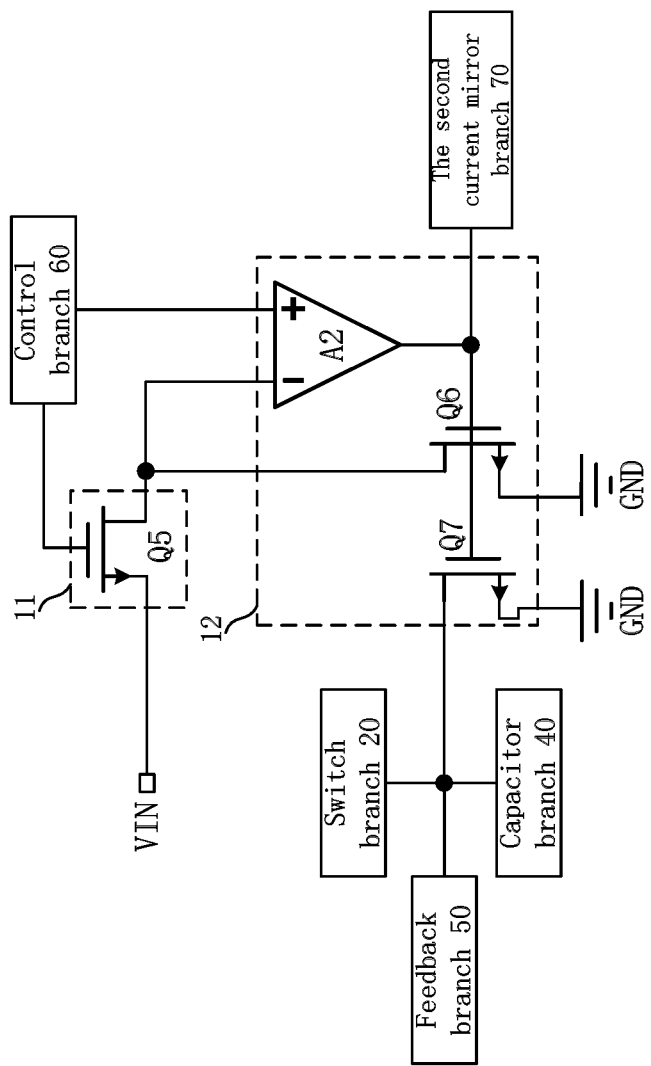
FIG. 6 is a schematic diagram of a circuit structure of a current sampling branch provided by an embodiment of the present application.

In an embodiment, as shown in FIG. 6, the current sampling branch 10 includes a current sampling unit 11 and a feedback unit 12. The current sampling unit 11 is connected to the control branch 60 and the feedback unit 12. The feedback unit 12 is connected to the capacitor branch 40, the switch branch 20, the feedback branch 50 and the second current mirror branch 70.

Specifically, the current sampling unit 11 is configured to output the second discharging current to the feedback unit 12 based on the second current. The feedback unit 12 is configured to adjust the second discharging current based on the second current, so that the second discharging current is 1/K of the second current. K is greater than 1. The feedback unit 12 is also configured to output the first discharging current proportional to the second discharging current. In some embodiments, the value of K may be in a range from 500 to 5000, so as to reduce the shunting of the second current by the second discharging current and improve the efficiency of the current detection circuit.

FIG. 6 also exemplarily shows a structure of the current sampling unit 11. As shown in FIG. 6, the current sampling unit 11 includes a fifth transistor Q5. The first terminal of the fifth transistor Q5 is connected to the first terminal of the first transistor Q1 in the control branch 60. The second terminal of the fifth transistor Q5 is connected to the input voltage VIN, and the third terminal of the fifth transistor Q5 is connected to the feedback Unit 12.

In this embodiment, taking an example that the fifth transistor Q5 is an NMOS transistor. The gate of the NMOS transistor is the first terminal of the fifth transistor Q5. The source of the NMOS transistor is the second terminal of the fifth transistor Q5, and the drain of the NMOS transistor is the third terminal of the fifth transistor Q5.

The fifth transistor Q5 operates in the variable resistance region, that is, the fifth transistor Q5 can be regarded as a variable resistance controlled by the voltage difference between the source and the gate of the fifth transistor Q5.

FIG. 6 also exemplarily shows a structure of the feedback unit 12. As shown in FIG. 6, the feedback unit 12 includes a second operational amplifier A2, a sixth transistor Q6 and a seventh transistor Q7. The non-inverting input terminal of the second operational amplifier A2 is connected to the third terminal of the first transistor Q1 in the control branch 60, and the inverting input terminal of the second operational amplifier A2 is connected to the third terminal of the fifth transistor Q5 and the third terminal of the sixth transistor Q6 in the current sampling unit 11. The output terminal of the second operational amplifier A2 is connected to the first terminal of the sixth transistor Q6 and the first terminal of the seventh transistor Q7. The second terminal of the sixth transistor Q6 and the second terminal of the seventh transistor Q7 are both grounded to GND. The third terminal of the seventh transistor Q7 is connected to the capacitor branch 40, the feedback branch 50 and the switch branch 20.

In this embodiment, the sixth transistor Q6 and the seventh transistor Q7 are both NMOS transistors as an example. The gate of the NMOS transistor is the first terminal of the sixth transistor Q6 (or the seventh transistor Q7). The source of the NMOS transistor is the second terminal of the sixth transistor Q6 (or the seventh transistor Q7). The drain of the NMOS transistor is the third terminal of the sixth transistor Q6 (or the seventh transistor Q7).

The sixth transistor Q6 and the seventh transistor Q7 both operate in the saturation region, that is, the sixth transistor Q6 (or the seventh transistor Q7) can be regarded as variable current source controlled by the voltage difference between the gate and source of the sixth transistor Q6 (or the seventh transistor Q7).

Please refer to FIG. 5 and FIG. 6 together. The second terminal of the fifth transistor Q5 and the second terminal of the first transistor Q1 are both connected to the input voltage VIN. The first terminal of the fifth transistor Q5 is connected to the first terminal of the first transistor Q1. The ratio of the size of the fifth transistor Q5 to the size of the first transistor Q1 can be set to be 1:K. Meanwhile, the third terminal of the fifth transistor Q5 and the third terminal of the first transistor Q1 are connected to the two input terminals of the second operational amplifier A2 respectively.

When the circuit shown in FIG. 6 is in operation, the second operational amplifier A2 amplifies the difference between the voltages at its two input terminals and outputs a fourth voltage signal. The fourth voltage signal controls the gate voltage of the sixth transistor Q6 to adjust the second discharging current Iin, which in turn makes the voltage drop caused by the second discharging current between the source and the drain of the fifth transistor Q5 exactly equal to the voltage drop between the source and the drain of the first transistor Q1. At this time, the voltages at the two input terminals of the second operational amplifier A2 are equal. The voltages at the third terminals of the fifth transistor Q5 and the first transistor Q1 are equal. The ratio of the currents flowing through the two transistors is the ratio of the transistor sizes, namely:

$$IIN = Iin \times K \quad (4)$$

Iin is the second discharging current.

When the second current changes, the voltages at the two input terminals of the second operational amplifier A2 are no longer equal. In response to the change in the voltage difference between the input terminals, the second operational amplifier A2 adjusts the second discharging current by changing the fourth voltage signal it outputs, so that a fixed ratio K of the second discharging current to the new second current (i.e. the changed second current) is maintained.

At the same time, the second discharging current passes through the common gate and common source structure formed by the sixth transistor Q6 and the seventh transistor Q7. The first discharging current I2 is generated by mirroring at the drain terminal of the seventh transistor Q7. The first discharging current I2 is proportional to the second discharging current Iin. In some embodiments, the first discharging current I2 is equal to the second discharging current Iin.

Figure 7:
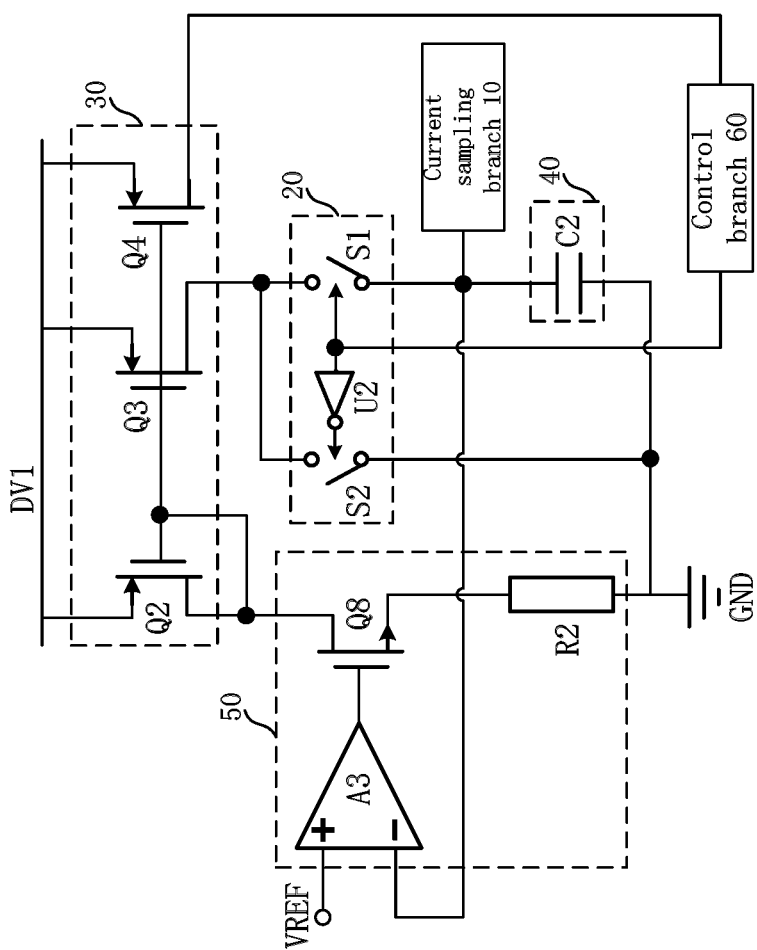
FIG. 7 is a schematic diagram of the circuit structure of a switch branch, a first current mirror branch, a capacitor branch, and a feedback branch provided by an embodiment of the present application.

Referring to FIG. 7, a structure of the switch branch 20 is exemplarily shown in FIG. 7. As shown in FIG. 7, the switch branch 20 includes an inverter U2, a first switch S1 and a second switch S2. The input terminal of the inverter U2 is connected to the first terminal of the first switch S1 and the control branch 60. The output terminal of the inverter U2 is connected to the first terminal of the second switch S2. The second terminal of S1 is connected to the second terminal of the second switch S2 and the first current mirror branch 30. The third terminal of the first switch S1 is connected to the capacitor branch 40 and the seventh transistor Q7 in the current sampling branch 10. The third terminal of the switch S2 is connected to the feedback branch 50. The third terminal of the second switch S2 is grounded to GND.

The first switch S1 and the second switch S2 may be any controllable switches, such as insulated gate bipolar transistor (IGBT) devices, integrated gate commutated thyristor (IGCT) devices, gate turn off thyristor (GTO) devices, silicon controlled rectifier (SCR) devices, junction gate field effect transistor (JFET) devices, MOS controlled thyristor (MCT) devices, etc. Furthermore, the first switch S1 and the second switch S2 shown in FIG. 7 may be implemented as a plurality of switches connected in parallel.

In this embodiment, when the first voltage signal output by the control branch 60 is at a high level, the first switch S1 is turned on to establish the connection between the first current mirror branch 30 and the capacitor branch 40, and the capacitor branch 40 is charged by the first charging current. At the same time, the first voltage signal is converted into a low level signal after passing through the inverter U2, so that the second switch S2 is turned off. It can be understood that, in one cycle, the time period when the first voltage signal is at a high level corresponds to Ton in the above embodiment.

When the first voltage signal is at a low level, the first switch S1 is turned off to disconnect the first current mirror branch 30 from the capacitor branch 40, and the capacitor branch 40 stops charging. At the same time, the first voltage signal is converted into a high-level signal after passing through the inverter U2, so that the second switch S2 is turned on to provide a current loop, thereby maintaining the first charging current as a substantially constant DC.

FIG. 7 also exemplarily shows a structure of the first current mirror branch 30. As shown in FIG. 7, the first current mirror branch 30 includes a second transistor Q2 and a third transistor Q3.

The first terminal of the second transistor Q2 is connected to the third terminal of the second transistor Q2, the first terminal of the third transistor Q3 and the feedback branch 50. The second terminal of the second transistor Q2 and the second terminal of the third transistor Q3 are both connected to the first DC power supply DV1. The third terminal of the third transistor Q3 is connected to the switch branch 20.

In one embodiment, the first current mirror branch 30 further includes a fourth transistor Q4. The first terminal of the fourth transistor Q4 is connected to the first terminal of the third transistor Q3. The second terminal of the fourth transistor Q4 is connected to the second terminal of third transistor Q3. The third terminal of the fourth transistor Q4 is connected to the first terminal of the first resistor R1 in the control branch 40.

In this embodiment, the second transistor Q2, the third transistor Q3 and the fourth transistor Q4 are all PMOS transistors as an example. The gate of the PMOS transistor is the first terminal of the second transistor Q2 (the third transistor Q3 or the fourth transistor Q4). The source of the PMOS transistor is the second terminal of the second transistor Q2 (the third transistor Q3 or the fourth transistor Q4). The drain of the PMOS transistor is the third terminal of the second transistor Q2 (the third transistor Q3 or the fourth transistor Q4).

The second transistor Q2, the third transistor Q3 and the fourth transistor Q4 all operate in the saturation region, that is, the second transistor Q2 (the third transistor Q3 or the fourth transistor Q4) can be regarded as a variable current source being controlled by the voltage difference between the source and gate of the second transistor Q2 (the third transistor Q3 or the fourth transistor Q4).

FIG. 7 also exemplarily shows a structure of the capacitor branch 40. As shown in FIG. 7, the capacitor branch 40 includes a second capacitor C2. The first terminal of the second capacitor C2 is connected to the switch branch 20, the feedback branch 50 and the current sampling branch 10. The second terminal of the second capacitor C2 is grounded to GND.

FIG. 7 also exemplarily shows a structure of the feedback branch 50. As shown in FIG. 7, the feedback branch includes a third operational amplifier A3, an eighth transistor Q8 and a second resistor R2.

The non-inverting input terminal of the third operational amplifier A3 is used to receive the first preset voltage VREF, and the inverting input terminal of the third operational amplifier A3 is connected to the switch branch 20, the capacitor branch 40 and the current sampling branch 10. The output terminal of the third operational amplifier A3 is connected to the first terminal of the eighth transistor Q8. The second terminal of the eighth transistor Q8 is connected to the first terminal of the second resistor R2. The second terminal of the second resistor R2 is grounded to GND. The second terminal of the eighth transistor Q8 is connected to the first terminal of the second resistor R2. The third terminal of the eight transistor Q8 is connected to the second terminal of the first current mirror branch 30. The third operational amplifier A3 amplifies the difference between the voltage at the first terminal of the second capacitor C2 and the first preset voltage VREF, and outputs a fifth voltage signal, which is used to control the eighth transistor Q8 to determine the second charging current flowing through the second transistor Q2, the eighth transistor Q8 and the second resistor R2. When the voltage at the first terminal of the second capacitor C2 is higher than the first preset voltage VREF, the third operational amplifier A3 outputs a fifth voltage signal to control the gate voltage of the eighth transistor Q8 to decrease, thereby reducing the second charging current. On the contrary, when the voltage at the first terminal of the second capacitor C2 is lower than the first preset voltage VREF, the third operational amplifier A3 outputs a fifth voltage signal to control the gate voltage of the eighth transistor Q8 to increase, thereby increasing the second charging current. The third operational amplifier A3 maintains the average value of the voltage at the first terminal of the second capacitor C2 equal to the first preset voltage VREF by adjusting the second charging current.

In this embodiment, take the eighth transistor Q8 as an NMOS transistor as an example. The gate of the NMOS transistor is the first terminal of the eighth transistor Q8. The source of the NMOS transistor is the second terminal of the eighth transistor Q8, and the drain of the NMOS transistor is the third terminal of the eighth transistor Q8.

The eighth transistor Q8 operates in the saturation region, that is, the eighth transistor Q8 is a variable current source controlled by the voltage difference between the gate and the source of the eighth transistor Q8.

In the circuit structure shown in FIG. 7, the first switch S1 and the second switch S2 are controlled by a pulse signal (i.e. a first voltage signal) with a pulse width of Ton. When the first voltage signal is at a low level, the first switch S1 is turned off. The second switch S2 is turned on. The charge on the second capacitor C2 is discharged with the first discharging current I2, and the voltage on the second capacitor C2 decreases. When the first voltage signal is at a high level, the first switch S1 is turned on. The second switch S2 is turned off. The second capacitor C2 is charged by the first charging current I1. At the same time, the second capacitor C2 is discharged by the first discharging current I2, and the voltage on the second capacitor C2 increases. The first charging current is generated at the drain of the third transistor Q3 after the second charging current generated by the control branch 50 is mirrored by the first current mirror branch 30. The whole process cycle mentioned above is repeated, and finally the circuit reaches a steady state under the action of the feedback branch. Specifically, in a steady state, the total charging charge and the total discharging charge of the second capacitor C2 in a period T are equal, and the voltage on the second capacitor C2 is equal to the first preset voltage VREF. From the charge conservation theory, the following equation can be obtained:

$$I1 \times Ton = I2 \times T \quad (5)$$

I2 and IIN are proportional, that is, when I2=IIN/K, combining equation (3) and equation (5), the following equation can be obtained:

$$I1 = IIN/(D \times K) \quad (6)$$

Therefore, from Equation (6), it can be known that the information of the first current can be obtained without the detection resistor being connected in series at the output terminal.

When the first duty cycle D or the second current IIN changes, the charging time Ton on the second capacitor C2 or the first charging current I1 also changes respectively, resulting in the total charging charge of the second capacitor C2 in one cycle changes, which results in a difference between the voltage on the second capacitor C2 and the first preset voltage VREF. The feedback branch 50 outputs a fifth voltage signal according to the difference to adjust the first charging current, so as to adjust the total charging charge of the second capacitor C2 in one cycle T to make it equal to the total discharging charge of the second capacitor C2 in one cycle, and the voltage on C2 is stabilized at the first preset voltage VREF. After the circuit returns to a steady state, the first charging current I1, the first discharging current I2 and the first duty cycle D can still maintain the relationships in Equations (5) and (6).

Combining the circuit structures shown in FIGS. 5-7, and combining equations (3) and (6), the following equation can be obtained:

$$Iout = I1 \times K \quad (7)$$

It can be seen from Equation (7) that by combining the circuit structures shown in FIGS. 5 to 7, the first charging current I1 can be obtained without an external detection resistor, thereby obtaining the magnitude of the first current Iout flowing into the electrical load 200. Then, the control branch 40 can adjust the first duty cycle in real time according to the determined first current, so as to precisely control the magnitude of the first current and realize lossless current control.

Figure 8:
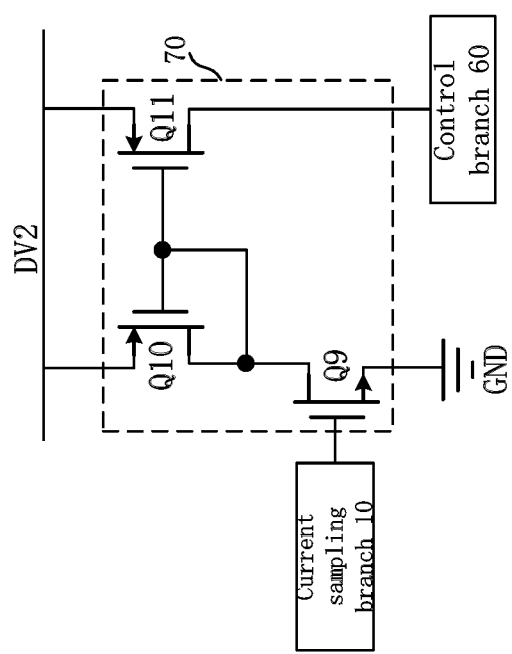
FIG. 8 is a schematic diagram of a circuit structure of a second current mirror branch provided by an embodiment of the present application.

Please refer to FIG. 8. FIG. 8 exemplarily shows a structure of the second current mirror branch 70. As shown in FIG. 8, the second current mirror branch 70 includes a ninth transistor Q9, a tenth transistor Q10 and an eleven transistors Q11.

The first terminal of the ninth transistor Q9 is connected to the first terminal of the sixth transistor Q6 in the current sampling branch 10. The second terminal of the ninth transistor Q9 is grounded to GND, and the third terminal of the ninth transistor Q9 is connected to the third terminal of the tenth transistor Q10, the first terminal of the tenth transistor Q10 and the first terminal of the eleventh transistor Q11. The second terminal of the tenth transistor Q10 and the second terminal of the eleventh transistor Q11 are both connected to a second DC the power supply DV2. The third terminal of the eleventh transistor Q11 is connected to the first terminal of the third resistor R3 in the control branch 90. The second DC power source DV2 and the first DC power source DV1 may be the same or different, which is not specifically limited in this embodiment of the present application.

In this embodiment, the first terminal of the ninth transistor Q9 is connected to the first terminal of the sixth transistor Q6. The second terminal of the ninth transistor Q9 and the second terminal of the sixth transistor Q6 are both grounded to GND. Then a current proportional to the second discharging current Iin flowing through the sixth transistor Q6 can be generated on the ninth transistor Q9. Likewise, the tenth transistor Q10 and the eleventh transistor Q11 will proportionally mirror the current flowing through the ninth transistor Q9 to the eleventh transistor Q11 to output a third discharging current that is proportional to the first discharging current. The third discharging current passes through the third resistor R3 to form a second detection voltage, which is compared with the second reference voltage VF2 representing the preset input current threshold to output a third voltage signal to the controller U1, so that the controller U1 based on the third voltage signal adjusts the first duty cycle, so that the second current does not exceed the maximum current that the power supply providing the input voltage VIN can withstand, which is beneficial to protect the power supply providing the input voltage VIN.

Figure 9:
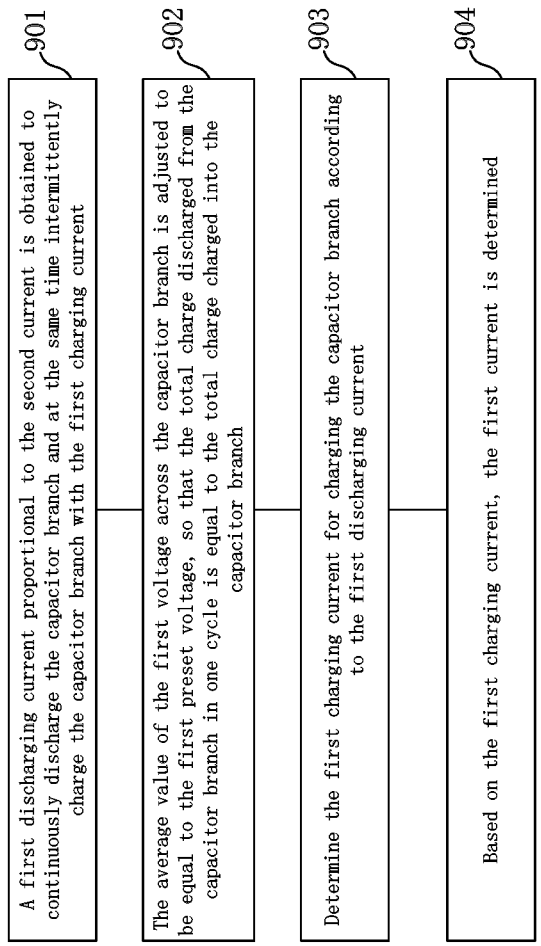
FIG. 9 is a flowchart of a current detection method provided by an embodiment of the present application.

Please refer to FIG. 9, which is a flowchart of a current detection method provided by an embodiment of the present application. The current detection method is applied to a current detection circuit. The current detection circuit is connected to an electrical load, and a capacitor branch is arranged in the current detection circuit.

The current detection method is used for detecting the first current flowing into the electrical load according to the second current flowing into the current detection circuit. The current detection method includes the following steps:

Step 901: obtain a first discharging current proportional to the second current, so as to continuously discharge the capacitor branch. At the same time, intermittently charge the capacitor branch with the first charging current.

Step 902: adjust the average value of the first voltage across the capacitor branch to be equal to the first preset voltage, so that the total charge discharged from the capacitor branch in one cycle is equal to the total charge charged into the capacitor branch.

Step 903: determine a first charging current for charging the capacitor branch according to the first discharging current.

Step 904: based on the first charging current, determine a first current.

In one cycle, the duration of charging the capacitor branch is the duration that the input voltage supplies power to the electrical load, and the duration of discharging the capacitor branch is the duration of one cycle. That is, the input voltage and the electrical load are intermittently connected with the first duty cycle. For example, when the first voltage signal is at a high level, the input voltage is connected to the electrical load, and the input voltage supplies power to the electrical load. When the first voltage signal is at a low level, the connection between the input voltage and the electrical load is disconnected, and the electrical load 200 is powered by the energy stored in the first inductor L1.

In this embodiment, the first discharging current is proportional to the second current, that is, the second current can be represented by the first discharging current. Then, by making the total charge discharged from the capacitor branch equal to the total charge charged in one cycle, the first charging current satisfying the charge balance, and the first current can be represented by the first charging current. In conclusion, the detection process of the first current is realized.

In one embodiment, the process of determining the first charging current for charging the capacitor branch according to the first discharging current in step 903 includes the following steps: when the charge-discharge balance is reached in one cycle, and the average value of the first voltage is equal to the first preset voltages, the corresponding first charging currents satisfy $I1=I2 \times T/Ton$. Among them, I1 is the first charging current. I2 is the first discharging current. Ton is the duration of charging the capacitor branch in one cycle, and T is the duration of one cycle. At this time, the first charging current I1 is a current proportional to the first current and can be used to represent the first current.

In one embodiment, the second current is equal to K times the first discharging current, where K is greater than 1. Then, the process of determining the first current based on the first charging current in step 904 includes the following steps: determining the magnitude of the first current by the following formula: $Iout=I1 \times K$. Iout is the first current.

It should be understood that for the specific control of the current detection circuit and the beneficial effects produced in the method embodiments, reference may be made to the corresponding descriptions in the above-mentioned current detection circuit embodiments, which are not repeated here for brevity.

Figure 10:
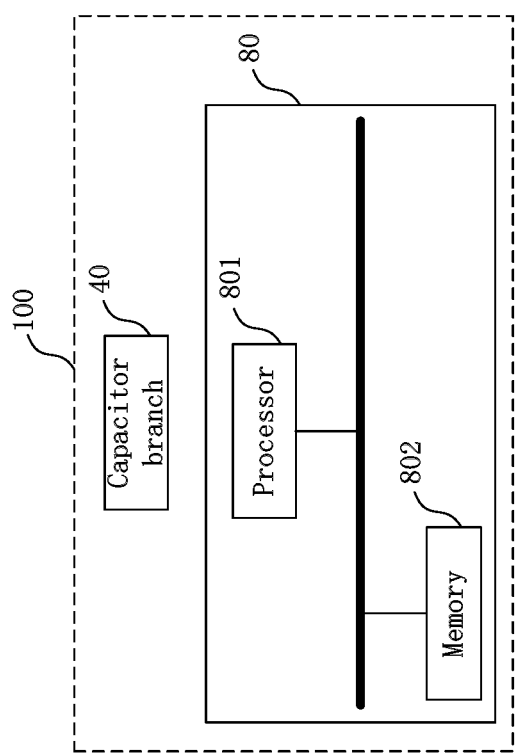
FIG. 10 is a schematic structural diagram of a current detection circuit provided by another embodiment of the present application.

Please refer to FIG. 10, which is a schematic structural diagram of a current detection circuit provided by the present application. As shown in FIG. 10, the current detection circuit 100 includes a capacitor branch 40 and a control processing unit 80.

The capacitor branch 40 is used for charging and discharging. The control processing unit 80 may adopt a microcontroller unit (Microcontroller Unit, MCU) or a digital signal processing (Digital Signal Processing, DSP) controller or the like.

The control processing unit 80 includes at least one processor 801 and a memory 802. The memory 802 can be built in the control processing unit 80, or can be externally located outside the control processing unit 80. The memory 802 can also be a remotely set memory. The control processing unit 80 is connected through a network.

As a non-volatile computer-readable storage medium, the memory 802 can be used to store non-volatile software programs, non-volatile computer-executable programs and modules. The memory 802 may include a storage program area and a storage data area. The storage program area may store an operating system, an application program required for at least one function. The storage data area may store data created according to the use of the terminal, and the like. Additionally, memory 802 may include high-speed random access memory, and may also include non-volatile memory, such as at least one magnetic disk storage device, flash memory device, or other non-volatile solid-state storage device. In some embodiments, the memory 802 may optionally include memory located remotely from the processor 801, and these remote memories may be connected to the terminal through a network. Examples of such networks include, but are not limited to, the internet, an intranet, a local area network, a mobile communication network, and combinations thereof.

The processor 801 executes various functions of the terminal and processes data by running or executing the software programs and/or modules stored in the memory 802, and calling the data stored in the memory 802, so as to monitor the terminal as a whole, for example, the current detection method described in any one of the embodiments of the present application is implemented.

The number of processors 801 may be one or more, and one processor 801 is taken as an example in FIG. 10. The processor 801 and the memory 802 may be connected by a bus or other means. The processor 801 may include a central processing unit (CPU), a digital signal processor (DSP), an application specific integrated circuit (ASIC), a controller, a field programmable gate array (FPGA) device, and the like. The processor 801 may also be implemented as a combination of computing devices, e.g., a combination of a DSP and a microprocessor, multiple microprocessors, one or more microprocessors combined with a DSP core, or any other such configuration.

An embodiment of the present application further provides a charger, which includes a current detection circuit as in any of the embodiments of the present application, for example, the current detection circuit 100 in FIG. 2 to FIG. 8, or the current detection circuit 100 in FIG. 10.

Finally, it should be noted that the above embodiments are only used to illustrate the technical solutions of the present application, but not to limit them. Under the idea of the present application, the technical features in the above embodiments or different embodiments can also be combined, and the steps may be carried out in any order, and there are many other variations of the different aspects of the present application as described above, which are not provided in detail for the sake of brevity. Although the present application has been described in detail with the reference to the foregoing embodiments, those skilled in the art should understand that it is still possible to modify the technical solutions recorded in the foregoing embodiments, or to perform equivalent replacements on some of the technical features. These modifications or replacements do not make the essence of the corresponding technical solutions deviate from the scope of technical solutions of the embodiments of the present application.

What is claimed is:

1. A current detection circuit used to connect with an electrical load and to detect a first current flowing into the electrical load, the current detection circuit comprising:
    a current sampling branch, a switch branch, a first current mirror branch, a capacitor branch, a feedback branch and a control branch, wherein:
        the control branch is connected to the switch branch and the electrical load, and wherein the control branch is used for being input a second current when connected to an input voltage, outputting the first current to the electrical load, and outputting a first voltage signal with a first duty cycle to the switch branch;
        the current sampling branch is connected to the capacitor branch and the control branch, and wherein the current sampling branch is configured to output a first discharging current proportional to the second current to the capacitor branch based on the second current;
        the switch branch is connected to the first current mirror branch and the capacitor branch, and wherein the switch branch is used for establishing and disconnecting a connection between the first current mirror branch and the capacitor branch based on the first duty cycle, and wherein when the first current mirror branch is connected to the capacitor branch, the first current mirror branch outputs a first charging current to the capacitor branch;
        the capacitor branch is configured to be charged in response to the first charging current and to be discharged in response to the first discharging current;
        the first current mirror branch is connected to the feedback branch, and the first current mirror branch is configured to output the first charging current proportional to a second charging current flowing through the feedback branch; and
        the feedback branch is connected to the capacitor branch, and the feedback branch is configured to adjust the second charging current based on a first voltage across the capacitor branch, and adjust an average value of the first voltage across the capacitor branch to be equal to a first preset voltage through adjusting the first charging current, and wherein when the average value of the first voltage across the capacitor branch is equal to the first preset voltage, a ratio of the first discharging current to the first charging current is equal to the first duty cycle so as to make the first charging current represent the first current.

2. The current detection circuit according to claim 1, wherein:
    the first current mirror branch is further connected to the control branch;
    the first current mirror branch is further configured to output a third charging current proportional to the first charging current to the control branch, and wherein the third charging current is used to represent the first charging current; and
    the control branch is further configured to adjust the first duty cycle based on the third charging current to keep the first current equal to a preset output current, and wherein a ratio of the second current to the first current is equal to the first duty cycle.

3. The current detection circuit according to claim 2, wherein the control branch comprises a controller, a first transistor, a first power switch, a second power switch, a first inductor and a first capacitor, and wherein:
    a first terminal of the first transistor is connected to the controller and the current sampling branch;
    a second terminal of the first transistor is connected to the input voltage;
    a third terminal of the first transistor is connected to a third terminal of the first power switch and the current sampling branch;
    a second terminal of the first power switch is connected to a third terminal of the second power switch and a first terminal of the first inductor;
    a second terminal of the first inductor is connected to a first terminal of the first capacitor and the electrical load;
    a second terminal of the first capacitor is grounded; and
    a first terminal of the first power switch and a first terminal of the second power switch are both connected to the controller.

4. The current detection circuit according to claim 3, wherein the control branch further comprises a first operational amplifier and a first resistor, and wherein:
    the first resistor is connected to the first current mirror branch and the first operational amplifier;
    the first resistor is used for generating a first detection voltage based on the third charging current; and
    the first operational amplifier is used for amplifying a difference between the first detection voltage and a first reference voltage representing the preset output current, so as to output a second voltage signal to the controller, so that the controller adjusts the first duty cycle based on the second voltage signal.

5. The current detection circuit according to claim 4, wherein:
    a first terminal of the first resistor is connected to an inverting input terminal of the first operational amplifier and the first current mirror branch;
    a second terminal of the first resistor is grounded;
    a non-inverting input terminal of the first operational amplifier is used to receive the first reference voltage; and
    an output terminal of the first operational amplifier is connected to the controller.

6. The current detection circuit according to claim 1, wherein the first current mirror branch comprises a second transistor and a third transistor, and wherein:

a first terminal of the second transistor is connected to a third terminal of the second transistor, a first terminal of the third transistor and the feedback branch;

a second terminal of the second transistor and a second terminal of the third transistor are all connected to a first DC power supply; and a third terminal of the third transistor is connected to the switch branch.

7. The current detection circuit according to claim 6, wherein the first current mirror branch further comprises a fourth transistor, and wherein:

a first terminal of the fourth transistor is connected to the first terminal of the third transistor;

a second terminal of the fourth transistor is connected to the second terminal of the third transistor; and a third terminal of the fourth transistor is connected to the control branch.

8. The current detection circuit according to claim 1, wherein the current sampling branch comprises a current sampling unit and a feedback unit, and wherein:

the current sampling unit is connected to the control branch and the feedback unit;

the current sampling unit is configured to output the second discharging current to the feedback unit based on the second current; and the feedback unit is connected to the capacitor branch and the switch branch, and the feedback unit is configured to adjust the second discharging current based on the second current, so that the second discharging current is equal to 1/K of the second current, and is used to output the first discharging current proportional to the second discharging current, and wherein K>1.

9. The current detection circuit according to claim 8, wherein the current sampling unit comprises a fifth transistor, and wherein:

a first terminal of the fifth transistor is connected to the control branch;

a second terminal of the fifth transistor is connected to the input voltage; and a third terminal of the fifth transistor is connected to the feedback unit.

10. The current detection circuit according to claim 8, wherein the feedback unit comprises a second operational amplifier, a sixth transistor and a seventh transistor, and wherein:

a non-inverting input terminal of the second operational amplifier is connected to the control branch;

an inverting input terminal of the second operational amplifier is connected to the current sampling unit and a third terminal of the sixth transistor;

an output terminal of the second operational amplifier is connected to a first terminal of the sixth transistor and a first terminal of the seventh transistor;

a second terminal of the sixth transistor and a second terminal of the seventh transistor are both grounded; and a third terminal of the seventh transistor is connected to the capacitor branch and the switch branch.

11. The current detection circuit according to claim 1, wherein the switch branch comprises an inverter, a first switch and a second switch, and wherein:

an input terminal of the inverter is connected to a first terminal of the first switch and the control branch;

an output terminal of the inverter is connected to a first terminal of the second switch;

a second terminal of the first switch is connected to a second terminal of the second switch and the first current mirror branch;

a third terminal of the first switch is connected to the capacitor branch, the current sampling branch and the feedback branch; and a third terminal of the second switch is grounded.

12. The current detection circuit of claim 11, wherein:

when the first voltage signal is at a high level, the first switch is turned on to establish a connection between the first current mirror branch and the capacitor branch; and when the first voltage signal is at a low level, the first switch is turned off to disconnect the first current mirror branch from the capacitor branch.

13. The current detection circuit according to claim 1, wherein the capacitor branch comprises a second capacitor, and wherein:

a first terminal of the second capacitor is connected to the switch branch, the feedback branch and the current sampling branch; and a second terminal of the second capacitor is grounded.

14. The current detection circuit according to claim 1, wherein the feedback branch comprises a third operational amplifier, an eighth transistor and a second resistor, and wherein:

a non-inverting input terminal of the third operational amplifier is used to receive the first preset voltage;

an inverting input terminal of the third operational amplifier is connected to the switch branch, the capacitor branch and the current sampling branch;

an output terminal of the third operational amplifier is connected to a first terminal of the eighth transistor;

a second terminal of the eighth transistor is connected to a first terminal of the second resistor;

a second terminal of the second resistor is grounded; and a third terminal of the eighth transistor is connected to the first current mirror branch.

15. The current detection circuit according to claim 1, further comprising a second current mirror branch, wherein:

the second current mirror branch is connected to the current sampling branch and the control branch;

the second current mirror branch is used for outputting a third discharging current proportional to the first discharging current, and the third discharging current is output to the control branch; and the control branch is further configured to determine whether the second current is greater than a preset input current threshold based on the third discharging current, so as to reduce the first duty cycle when the second current is greater than the preset input current threshold.

16. The current detection circuit according to claim 15, wherein the second current mirror branch comprises a ninth transistor, a tenth transistor and an eleventh transistor, and wherein:

a first terminal of the ninth transistor is connected to the current sampling branch;

a second terminal of the ninth transistor is grounded;

a third terminal of the ninth transistor is connected to a third terminal of the tenth transistor, a first terminal of the tenth transistor and a first terminal of the eleventh transistor;

a second terminal of the tenth transistor and a second terminal of the eleventh transistor are both connected to a second DC power supply; and a third terminal of the eleventh transistor is connected to the control branch.

17. The current detection circuit according to claim 16, wherein the control branch further comprises a fourth operational amplifier and a third resistor, and wherein:
the third resistor is connected to the second current mirror branch and the fourth operational amplifier;
the third resistor is used for generating a second detection voltage based on the third discharging current; and
the fourth operational amplifier is used for comparing the second detection voltage with a second reference voltage representing the preset input current threshold to output a third voltage signal to a controller of the control branch, so that the controller can adjusts the first duty cycle based on the third voltage signal.

18. The current detection circuit according to claim 17, wherein:
a first terminal of the third resistor is connected to an inverting input terminal of the fourth operational amplifier and the second current mirror branch;
a non-inverting input terminal of the fourth operational amplifier is used to receive the second reference voltage; and
an output terminal of the fourth operational amplifier is connected to the control branch.

19. A current detection method applied to a current detection circuit connected between an input voltage and an electrical load, the current detection circuit comprising a capacitor branch, the method configured to detect a first current flowing into the electrical load according to a second current, the second current being an current fed into the current detection circuit when the current detection circuit is connected to the input voltage, the current detection method comprising:
obtaining a first discharging current proportional to the second current, so as to continuously discharge the capacitor branch, and at the same time, intermittently charge the capacitor branch with a first charging current;
adjusting an average value of a first voltage across the capacitor branch to be equal to a first preset voltage, so that a total charge discharged by the capacitor branch in one cycle is equal to a total charge charged in the one cycle;
according to the first discharging current, determining the first charging current for charging the capacitor branch, wherein in one cycle, a charging time of the capacitor branch is equal to the amount of time that the input voltage supplies power to the electrical load, and a discharge time of the capacitor branch is equal to a duration of one cycle; and
based on the first charging current, determining the first current.

20. The current detection method according to claim 19, wherein obtaining the first charging current for charging the capacitor branch through the first discharging current comprises:
the first charging current is obtained by the following equation: $I1=I2 \times T/Ton$ wherein, I1 is the first charging current, I2 is the first discharging current, Ton is a charging duration of the capacitor branch in one cycle, and T is the duration of one cycle.

21. The current detection method according to claim 20, wherein the second current is equal to K times the first discharging current, wherein K>1, and wherein determining the first current based on the first charging current includes:
a magnitude of the first current is determined by the following equation: $Iout=I1 \times K$, wherein Tout is the first current.

* * * * *

UNITED STATES PATENT AND TRADEMARK OFFICE
CERTIFICATE OF CORRECTION

PATENT NO. : 11,579,203 B1
APPLICATION NO. : 17/949349
DATED : February 14, 2023
INVENTOR(S) : Tan et al.

It is certified that error appears in the above-identified patent and that said Letters Patent is hereby corrected as shown below:

In the Claims

Column 26, Line 33, Claim 21; delete "Tout" and insert --Iout--.

Signed and Sealed this
Twenty-first Day of March, 2023

Katherine Kelly Vidal
*Director of the United States Patent and Trademark Office*